US006147391A

United States Patent [19]
Bowers et al.

[11] Patent Number: 6,147,391
[45] Date of Patent: Nov. 14, 2000

[54] SEMICONDUCTOR HETERO-INTERFACE PHOTODETECTOR

[75] Inventors: John E. Bowers, Santa Barbara; Aaron R. Hawkins, Goleta, both of Calif.

[73] Assignee: The Regents of the University of California, Oakland, Calif.

[21] Appl. No.: 09/272,870

[22] Filed: Mar. 19, 1999

Related U.S. Application Data

[63] Continuation of application No. 08/907,139, Aug. 6, 1997, which is a continuation of application No. 08/646,103, May 7, 1996, abandoned.

[51] Int. Cl.[7] ............................ H01L 27/14; H01L 33/00
[52] U.S. Cl. ............................................ 257/458; 257/439
[58] Field of Search ..................... 257/458, 439

[56] References Cited

U.S. PATENT DOCUMENTS

| | | | |
|---|---|---|---|
| 4,656,494 | 4/1987 | Kobayashi et al. | 357/30 |
| 4,729,963 | 3/1988 | Tabatabaie | 435/5 |
| 4,761,383 | 8/1988 | Matsushima et al. | 437/3 |
| 4,839,706 | 6/1989 | Brennan | 357/30 |
| 4,876,209 | 10/1989 | Forrest | 437/5 |
| 4,914,494 | 4/1990 | Webb | 351/30 |
| 4,992,386 | 2/1991 | Furuyama et al. | 437/3 |
| 5,008,726 | 4/1991 | Nakagawa et al. | . |
| 5,023,685 | 6/1991 | Bethea et al. | 357/30 |
| 5,144,637 | 9/1992 | Koch et al. | 372/50 |
| 5,252,142 | 10/1993 | Matsuyama et al. | . |
| 5,262,347 | 11/1993 | Sands | 437/86 |
| 5,286,671 | 2/1994 | Kurtz et al. | 437/64 |
| 5,346,848 | 9/1994 | Grupen-Shemansky et al. | 437/974 |
| 5,356,509 | 10/1994 | Terranova et al. | 117/58 |
| 5,385,632 | 1/1995 | Goossen | 437/5 |
| 5,386,137 | 1/1995 | Dell et al. | 257/458 |
| 5,389,797 | 2/1995 | Bryan et al. | 257/21 |
| 5,393,711 | 2/1995 | Biallas et al. | 437/231 |
| 5,407,556 | 4/1995 | Quenzer et al. | 437/61 |
| 5,527,732 | 6/1996 | Kasahara et al. | 437/3 |
| 5,573,975 | 11/1996 | Cunningham et al. | 437/129 |

FOREIGN PATENT DOCUMENTS

| | | | |
|---|---|---|---|
| 61-144816 | 7/1986 | Japan | 237/5 |
| 61-182272 | 8/1986 | Japan | . |
| 62-2669 | 1/1987 | Japan | 437/5 |
| 2144974 | 6/1990 | Japan | . |
| 2189982 | 7/1990 | Japan | . |
| 2194655 | 8/1990 | Japan | . |
| 372680 | 3/1991 | Japan | 257/200 |
| 3105986 | 5/1991 | Japan | 257/186 |
| 3184381 | 8/1991 | Japan | . |

OTHER PUBLICATIONS

Ackley, et al., "In 0.53Gao.47As/InP Floating Guard Ring Avalanche Photodiodes Fabricated by Double Diffusion", IEEE Photonics Technology Letters, vol. 2, No. 8, 1990.

Webb, et al., "Properties of Avalanche Photodiodes", RCA Review, vol. 35, pp. 234–279, (1974).

(List continued on next page.)

*Primary Examiner*—Stephen D. Meier
*Attorney, Agent, or Firm*—Gates & Cooper

[57] ABSTRACT

A method of processing semiconductor films and layers, utilizing heterojunctions, to create a photodetector. Novel combinations of materials, such as silicon and indium gallium arsenide (InGaAs) are combined using wafer fusion techniques to create heterojunctions that cannot be created by any other growth methods. Devices responsive to different regions of the optical spectrum or that have higher efficiencies are created.

31 Claims, 6 Drawing Sheets

OTHER PUBLICATIONS

Emmons, "Avalanche–Photodiode Frequency Response", Journal of Applied Physics, 38, No. 9, pp. 3705–3714.

Capasso, "Physics of Avalanche Photodetectors", Semiconductors and Semimetals, vol. 22, pp. 1–172, Academic Press, New York (1985).

Lo, et al., "Semiconductor lasers on Si substrates using the technology of bonding by atomic rearrangement" Appl. Phys. Lett., 62, pp. 1038–1040 (1993).

Mori, et al., "High–quality in InGaSa/InP multi–quantum–well structures on Si fabricated by direct bonding", Electron. Lett., 30, pp. 1008–1009.

Grant, "Electron and Hole Ionization Rates in Epitaxial Silicon at High Electric Fields", Solid–State Electronics, 16, pp. 1189–1203 (1973).

Cook, et al., "Electron and hole impact ionization coefficients in InP determined by photomultiplication measurements", Appl. Phys. Lett., 40, No. 7, pp. 589–591 (1982).

Law, et al., "Interband Scattering Effects on Secondary Ionization Coefficients in GaAs", Solid–State Electronics, 21, pp. 331–340 (1978).

Pearsall, Impact ionization rates for electrons and holes in $Ga_{0.47}In_{0.53}As$, Applied Physics Letters, 36, pp. 218–220, (1980).

Smith, et al., "Sensitivity of Avalanche Photodetector Receivers for Long–Wavelength Optical Communications," The Bell System Technical Journal, 61, No. 10, pp. 2929–2946 (1982).

Campbell, "Heterojunction Photodetectors for Optical Communications", Heterostructures and Quantum Devices, pp. 243–271, Academic Press, New York (1994).

Littlejohn, et al., High–field transport in InaAs and related heterostructures, Properties of Latticue–Matched and Strained Indium Gallium Arsenide, pp. 107–116, INSPEC, London, (1993).

SEMICONDUCTOR HETERO-INTERFACE PHOTODETECTOR

This patent application is a continuation of U.S. patent application Ser. No. 08/907,139, filed Aug. 6, 1997, pending of issue, which is a continuation of application Ser. No. 08/646,103, filed May 7, 1996, now abandoned.

STATEMENT AS TO RIGHTS TO INVENTIONS MADE UNDER FEDERALLY SPONSORED RESEARCH AND DEVELOPMENT

This invention was made with Government support under Grant No. F19628-95-C-0054 awarded by the United States Air Force. The Government has certain rights in this invention.

BACKGROUND OF THE INVENTION

1. Field of the Invention

This invention relates in general to a method of making a semiconductor device. More particularly, the invention relates to a process for making a heterojunction avalanche photodetector using non-lattice matched semiconductors.

2. Description of Related Art

The use of semiconductor materials to create various electronic devices is largely dependent on the requirements of the device for a given task, the ability to use certain materials together in a given device, and the cost for the finished device. As device requirements are tightened or increased, new methods and materials combinations are required to meet the requirements for the device.

An avalanche photodetector (APD) has two functions: the absorption and conversion of light to an electrical signal, and the amplification of that electrical signal through avalanche multiplication. These functions can be done by a single material, such as silicon, or by two materials grown epitaxially, one for the absorption and another for the multiplication. The performance of an APD is based on the achievable signal processing speed and noise, which are dependent on the absorption and multiplication efficiencies. These parameters are expressed by the responsivity, the 3-dB frequency bandwidth, and the excess noise factor. The excess noise factor and 3-dB bandwidth are dependent on the total device thickness and the ratio between electron and hole ionization coefficients of the material used for multiplication. The larger the ratio between the electron and hole ionization coefficients, the larger the gain bandwidth product of the APD will be. Further, the larger the coefficient ratio, the less noisy the APD will be.

Current devices that have tried to maximize detector performance have fallen short of desired efficiencies due to the trade off between absorption coefficient and electron/hole ionization coefficients. Materials, such as silicon, that have high electron/hole ionization coefficient ratios do not have good absorption in the desired optical regions, such as the telecommunications wavelengths of 1.3 and 1.5 $\mu$m. Materials that have good absorption do not have a high ionization coefficient ratio. Heterojunction devices have, until now, been limited to lattice matched materials, and device efficiencies have not been significantly increased through the use of heterojunction APDs because of the lattice matching limitation.

It can be seen then that there is a need for a method of making an APD that has high efficiency. It can also be seen that there is a need for a method of making an APD that has a high electron to hole ionization ratio in the multiplication region and a high absorption region for converting light into electricity. It can also be seen that there is a need for a device that can absorb light in the desired optical regions and efficiently and precisely convert that light into electrical signals.

SUMMARY OF THE INVENTION

To minimize the limitations in the prior art described above, and to minimize other limitations that will become apparent upon reading and understanding the present specification, the present invention discloses a powerful and highly productive apparatus and method for making APDs. The present invention is comprehensive and is fully integrable with present fabrication methods.

The present invention solves the above-described problems by providing a method for fusing high ionization ratio materials with high efficiency absorption materials. One material is used as an absorption region for converting light into an electronic signal while another material is used for the amplification region. The method is easily performed and is relatively inexpensive. Further, the method provides for customization of semiconductor devices by bandwidth, since the material for the absorption region can be chosen to suit the bandwidth, without design regard for the amplification region, since lattice matching is no longer required.

One object of the present invention is to provide a method for making high efficiency avalanche photodetectors. Another object of the present invention is to provide a avalanche photodetector with a high ionization rate material in contact with a highly efficient absorption material.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of the method and product in accordance with the invention.

BRIEF DESCRIPTION OF THE DRAWINGS

Referring now to the drawings in which like reference numbers represent corresponding parts throughout.

DETAILED DESCRIPTION OF THE INVENTION

Figure 1A:
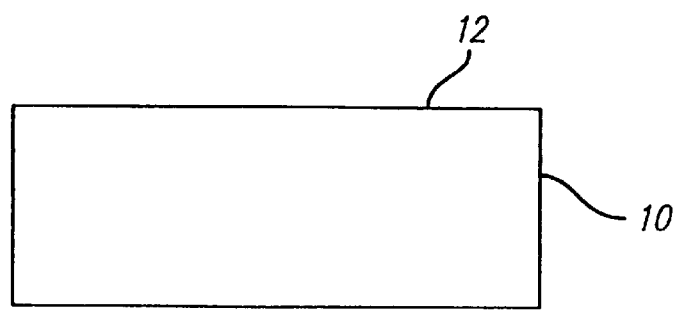
FIGS. 1A–1C are cross-sectional views of the preparation method used for the method and product of the invention.

In the following description of the preferred embodiment, reference is made to the accompanying drawings which form a part hereof, and in which is shown by way of illustration the specific embodiment in which the invention may be practiced. It is to be understood that other embodiments may be utilized and structural and functional changes may be made without departing from the scope of the present invention.

The present invention provides a method for making a heterojunction photodetector that has high efficiency and low dark current response characteristics.

To make a good photodetector, a low noise amplification region is needed. A low noise amplification region will have a high ratio of electron to hole ionization coefficients, which results in low noise amplification. Silicon is such a material, since it has a large (approximately 50:1) ratio of electron to hole ionization coefficients. Indium gallium arsenide (InGaAs) is a poor material for amplification, because the ratio between electron and hole ionization coefficients is approximately 1:1.

Previously, silicon has been fused to InP to monolithically combine InGaAs devices with silicon electronics for purposes of optoelectronic integration. The present invention fuses silicon directly to InGaAs which produces detectors with performance potentials superior to existing III–V APDs in the near-infrared and superior to silicon APDs in the visible.

Silicon is chosen as an APD multiplication region for its large electron to hole ionization coefficient ratio. These coefficients are dependent on the electric field applied to a material, but for example, at 240 kV/cm the electron to hole ratio is 50:1. In most III–V materials this ratio is much lower. For example, in InP at the same field strength the electron to hole ratio is 1:4. Comparing a silicon multiplication region to an InP multiplication region of the same width under a 240 kV/cm electric field, for a multiplication factor of 50, the 3-dB frequency bandwidth is nearly seven times higher in the silicon, and the excess noise factor is nearly five times lower. The increase in bandwidth and reduction in noise is even greater when comparing silicon with other III–V materials used as multiplication regions.

Further, InGaAs APDs have a high dark current (current generated under low or no-light conditions) because InGaAs is a narrow bandgap material. Indium Phosphide (InP) is preferred over InGaAs because InP has a larger bandgap energy than InGaAs. This larger bandgap results in lower dark currents from the avalanche region of the photodetector. InP still does not have the high ratio of electron to hole ionization coefficients, making InP a poor choice for a multiplication region.

Although silicon is an ideal candidate for the amplification (also called multiplication) region, it has an indirect bandgap energy, making silicon a poor absorption material. The absorption coefficient of silicon is approximately 1/100 of InP or InGaAs. If a material has a small absorption coefficient, a thick absorption layer of that material is required for high efficiency, which results in a large transit time and a reduced bandwidth. Further, silicon is limited to near infrared and visible detectors because of silicon's one micron bandgap.

The present invention also has a clear advantage over existing silicon APDs operating in the visible range. InGaAs has an absorption coefficient that is more than an order of magnitude higher than that of silicon at these wavelengths. This allows for a reduction in absorber thickness in the present invention detector compared to silicon APDs using silicon absorption regions. This reduction in thickness gives increased device speed and efficiency as well as lower device operating voltage.

Telecommunications and far infrared applications for detectors operate in bandwidths that exceed the capability of silicon devices. InP and InGaAs devices are able to operate in the 100 GHz range, whereas silicon is typically limited to 1 GHz. While the superiority of silicon as a multiplier is evident, silicon does not absorb in the near-infrared. Most notably, silicon does not absorb at the critical optical communications wavelengths of 1.3 and 1.55 µm. Until now, epitaxial growth techniques limited infrared APDs to infrared absorbing regions that can be lattice matched to multiplication regions, such as an InGaAs absorber and an InP multiplication region. Silicon was not a feasible choice as a multiplier due to its large lattice mismatch with known infrared absorbing layers, such as InGaAs. The present invention overcomes this limitation by using wafer fusion or other bonding techniques to integrate an InGaAs absorption region with silicon despite the large lattice mismatch of the two materials. The present invention outperforms the speed and noise characteristics of known combinations of III–V materials when operating in the near-infrared.

The fusion process of the present invention allows silicon to be fused or otherwise bonded to InGaAs or InP detectors, allowing each material to perform part of the photodetection process. The InP or InGaAs portion performs the absorption and conversion process, and the electron output of the absorption region is injected into the multiplication region, where the multiplication is performed by the silicon. This results in devices that have low noise current and can operate in high frequency applications.

Other materials may be used for either region depending on the desired application for the finished device.

Figure 1B:
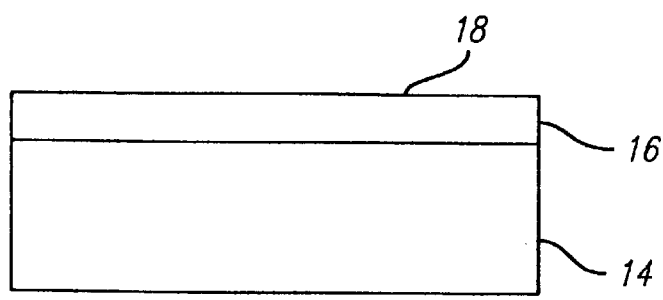
Figure 1C:
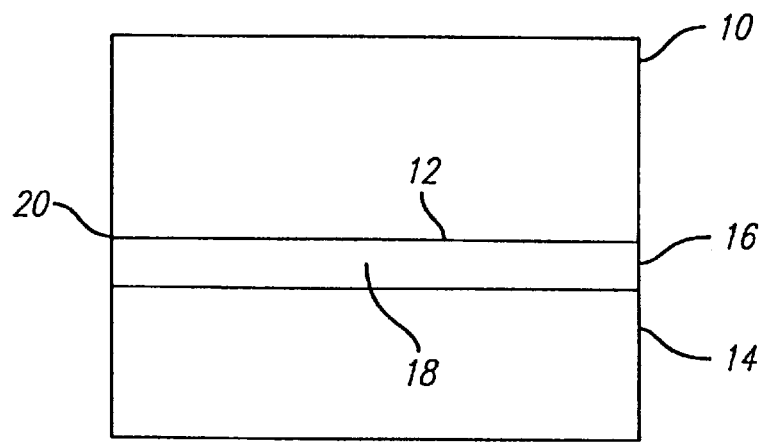

FIGS. 1A–1C are cross-sectional views of the preparation method used for the method and product of the invention. FIG. 1A shows a wafer 10 with top surface 12. The wafer 10 can be made of indium gallium arsenide ($In_xGa_{1-x}As$), but can be other materials, such as indium arsenide (InAs), indium antimonide (InSb), indium gallium arsenide antimonide ($In_xGa_{1-x}As_ySb_{1-y}$) mercury cadmium telluride ($Hg_xCd_{1-x}Te$), indium phosphide (InP), gallium nitride (GaN), aluminum gallium nitride ($Al_xGa_{1-x}N$), indium gallium nitride ($In_xGa_{1-x}N$), indium arsenide phosphide ($InAs_yP_{1-y}$), indium phosphide arsenide ($InP_yAs_{1-y}$), indium gallium arsenide phosphide ($In_xGa_{1-x}As_yP_{1-y}$), indium gallium aluminum arsenide ($In_xGa_yAl_{1-x-y}As$), lead tin telluride ($Pb_xSn_{1-x}Te$), aluminum arsenide (AlAs), aluminum antimonide (AlSb), zinc selenide (ZnSe), zinc telluride (ZnTe), boron nitride (BN), germanium (Ge), gallium phosphide (GaP), gallium arsenide (GaAs), gallium antimonide (GaSb), gallium aluminum arsenide ($Ga_xAl_{1-x}As$), gallium arsenide phosphide ($GaAs_yP_{1-y}$), gallium indium phosphide ($Ga_xIn_{1-x}P$), gallium indium antimonide ($Ga_xIn_{1-x}Sb$), or other ternary and quarternary materials. The subscripts x, y, 1-x, and 1-y denote the relative amounts of the atomic species in each ternary or quarternary materials and range from zero to one, inclusive.

FIG. 1B shows a second wafer 14. Second wafer 14 can have an epitaxial layer 16 grown on second wafer 14, but the epitaxial layer 16 is not required to practice the present invention. The epitaxial layer 16 can be of a different material than the second wafer 14, or the epitaxial layer 16 can be of the same material as the second wafer 14. The second wafer 14 is typically silicon, but can be other materials, such as Germanium. Epitaxial layer 16 has a fusion surface 18, opposite to where epitaxial layer 16 contacts second wafer 14.

FIG. 1C shows the wafer 10 physically in contact with second wafer 14. The top surface 12 and the fusion surface 16 are brought into close physical contact. Once this physical connection is made, and the wafer 10 and the second wafer 14 are properly aligned, heat is applied to the combination to fuse or bond the wafer 10 and the second wafer 14 together, whereby the top surface 12 and the fusion surface 18 are fused or bonded together.

The fusion process normally requires placing wafer 10 and second wafer 14 in an autoclave and raising the temperature to approximately 650 degrees Centigrade for silicon and indium gallium arsenide, but may be higher or lower for other materials. Other methods of bonding the wafers together may be used. The junction created by the physical connection between the wafer 10 and the second wafer 14 is the fusion junction 20.

The use of wafer fusion allows the lattice geometry of the wafer 10 and the lattice geometry of the second wafer 14 to be mismatched. Previously, epitaxial growth of layers on the wafer 10 required that the material to be grown on the top surface 12 have the same lattice constant as the material used in the wafer 10.

By using wafer fusion, lattice matching, described as the distance between the atomic nuclei in a crystalline structure, is no longer required. Further, the lattice geometry, such as face centered cubic, body centered cubic, etc. does not have to match between the materials. As a consequence, materials that have desired properties for different functions within a device, such as essentially the absorption and essentially the multiplication or amplification functions of a photodetector, can now be used in their desired application, and then fused to another material that performs the remainder of the functions required by the device in a more efficient fashion.

As an example, silicon is an excellent multiplier or amplifier, but a poor absorber in the infrared. InGaAs is an excellent infrared absorber, but a poor multiplier or amplifier. By using silicon for the multiplier, and InGaAs for the absorber, and then fusing the two portions of the detector into one unit, the end product is a better device than either material could have produced alone using other fabrication techniques.

Further, the use of wafer fusion allows even more tailoring of devices than currently available. Devices that require higher or lower multiplication or amplification, or very narrow bandwidth absorption regions, can now be made efficiently and for lower cost. Without wafer fusion, devices are limited to either lattice matched interfaces or very thin absorbing layers that are less than the critical strain limit, reducing the possibilities for the types of materials that can be used for the different functions within each device.

Figure 2:
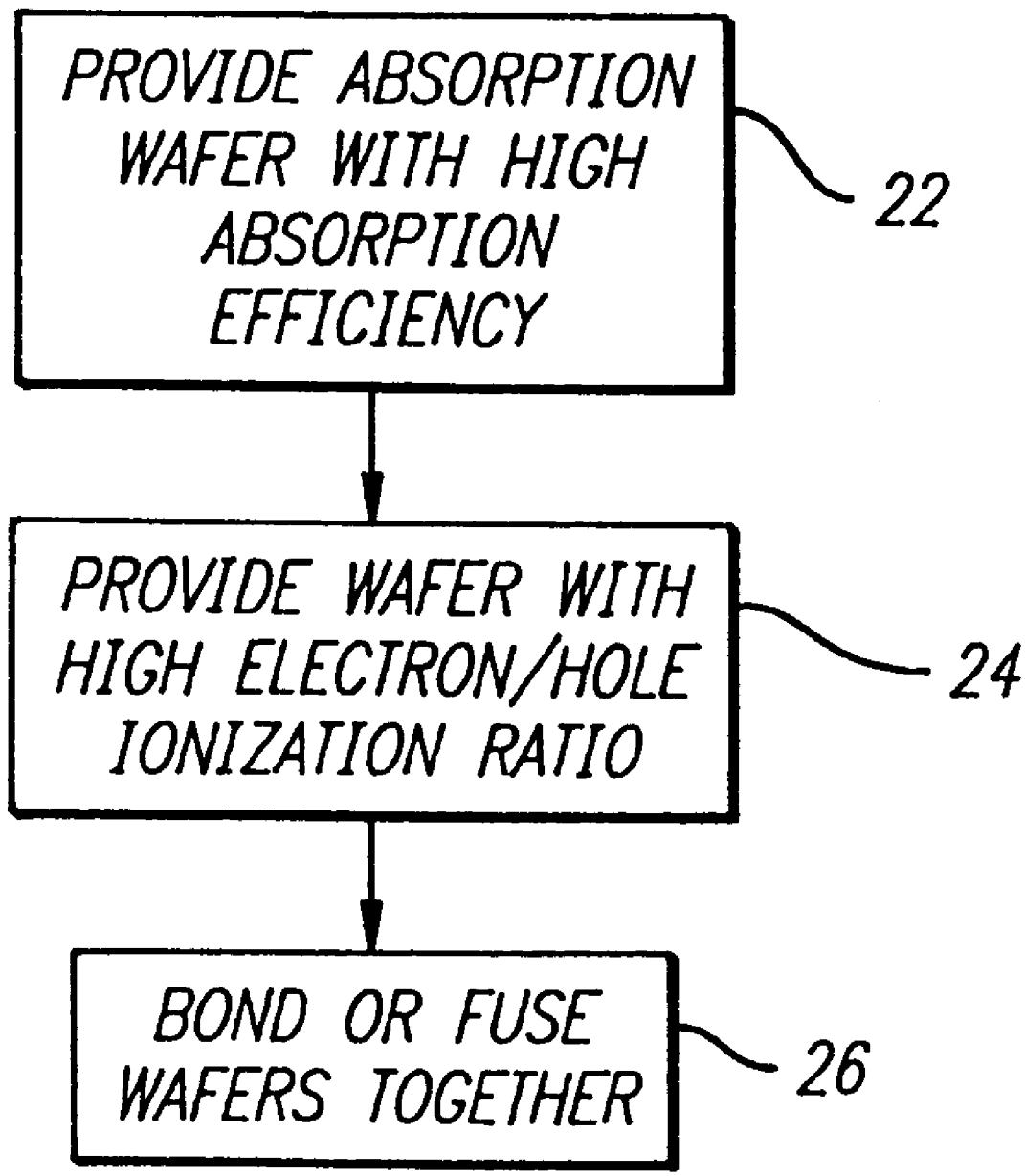
FIG. 2 is a flow chart describing the steps performed in the method of the invention.

FIG. 2 is a flow chart describing the steps performed in the method of the invention. Block 22 shows providing an absorption wafer with high absorption efficiency. Block 22 can be used to provide a wafer with a first desired property, such as high dielectric constant, low bandgap energy, direct bandgap energy, etc. Block 24 shows providing a second wafer with a high electron/hole ionization ratio. Block 24 can be used to provide a wafer with a second desired property, such as high conductivity, indirect band gap energy, etc. Block 26 shows bonding or fusing the wafers together.

Figure 3A:
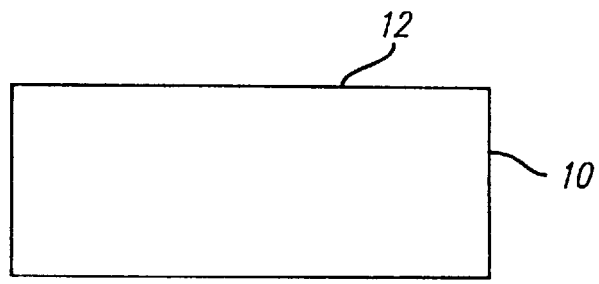
FIGS. 3A–3L are cross-sectional views of an alternative preparation method used for the method and product of the invention.
Figure 3B:
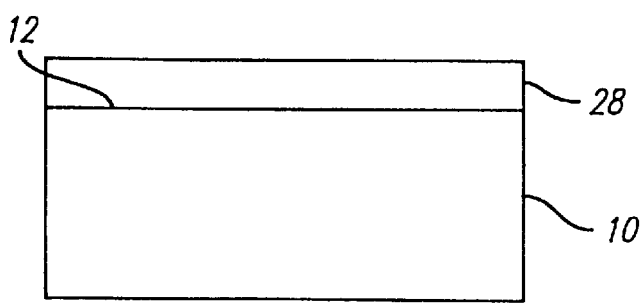

FIGS. 3A–3L are cross-sectional views of an alternative preparation method used for the method and product of the invention. FIG. 3A shows a wafer 10 with top surface 12. The wafer 10 is typically InP, but can be other materials. FIG. 3B shows an epitaxial layer 28 grown on top surface 12 of wafer 10. Epitaxial layer 28 is typically undoped $In_{0.53}Ga_{0.47}As$, but can be other materials as described in relation to FIG. 1A. Epitaxial layer 28 is typically 1.0 to 2.0 $\mu$m thick, but can be thicker or thinner.

Figure 3C:
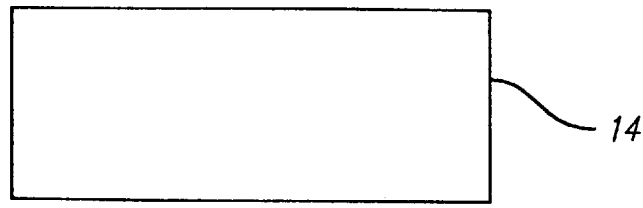
Figure 3D:
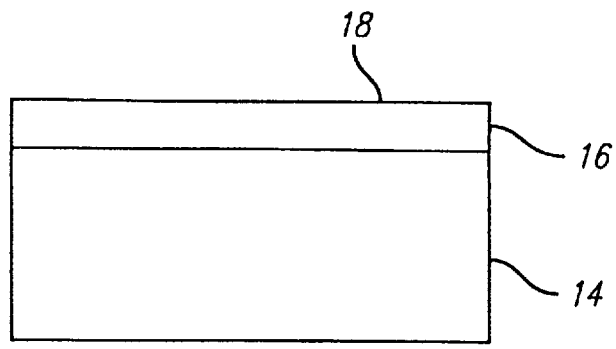

FIG. 3C shows a second wafer 14. Wafer 14 is typically silicon, but can be other materials. FIG. 3D shows epitaxial layer 16 grown on second wafer 14. The epitaxial layer 16 is typically n-doped silicon, but can be other materials. Epitaxial layer 16 is typically 0.5 to 2.5 $\mu$m thick, but can be thicker or thinner. Epitaxial layer 16 has a fusion surface 18.

Figure 3E:
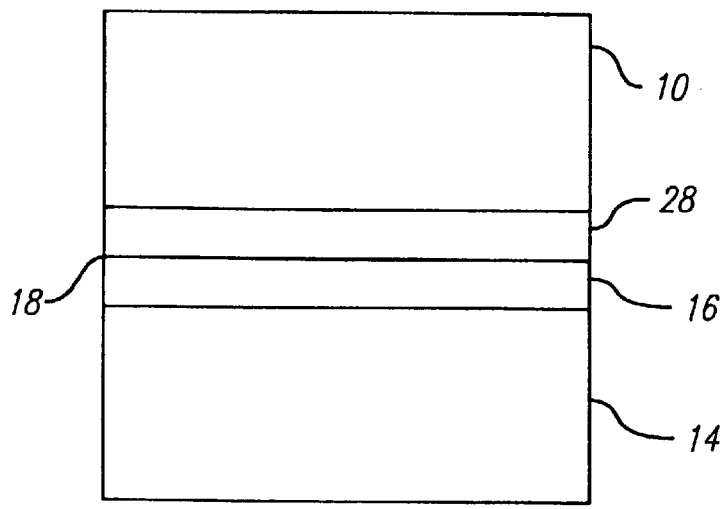

FIG. 3E shows epitaxial layer 28 physically in contact with fusion surface 18 of epitaxial layer 16. The epitaxial layer 28 is then fused to epitaxial layer 16.

Figure 3F:
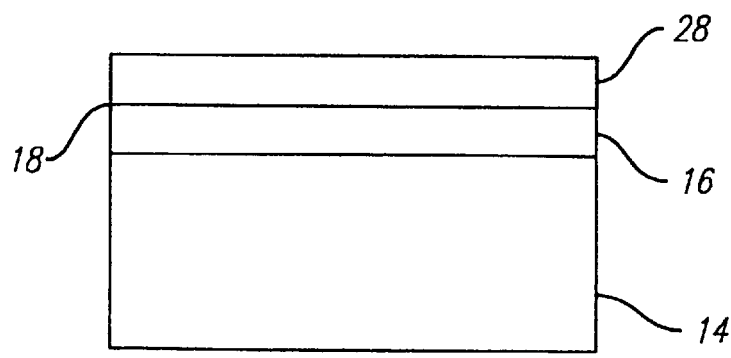
Figure 3G:
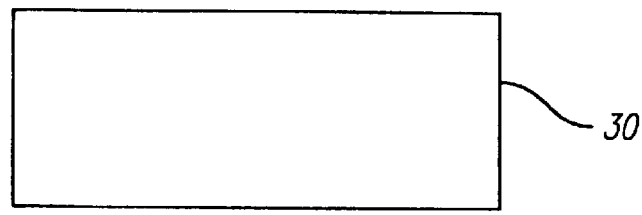
Figure 3H:
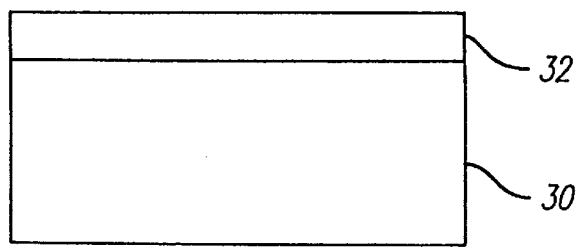

FIG. 3F shows exposing epitaxial layer 28 by removing wafer 10. FIG. 3G shows third wafer 30. Third wafer 30 is typically InP, but can be other materials. FIG. 3H shows growing epitaxial layer 32 on third wafer 30. Epitaxial layer 32 is typically p+ doped $In_{0.53}Ga_{0.47}As$, but can be other materials as described in relation to FIG. 1A.

Figure 3I:
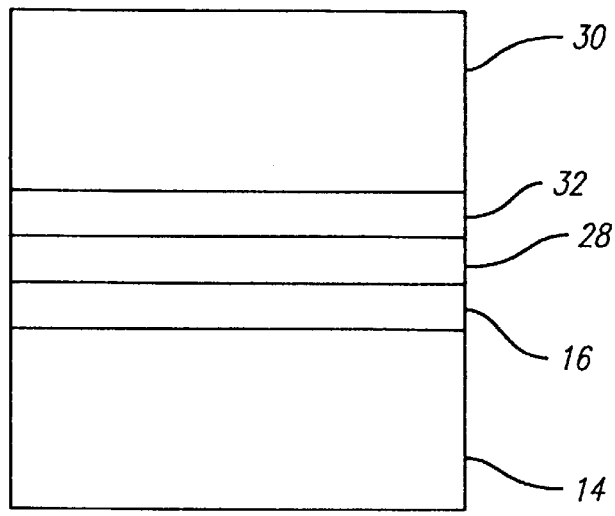

FIG. 3I shows epitaxial layer 32 in contact with epitaxial layer 28. Epitaxial layer 32 is fused to epitaxial layer 28. The second fusion of epitaxial layer 32 to epitaxial layer 28 is to minimize the diffusion of p-type dopants from the epitaxial layer 32 to the epitaxial layer 28 during the growth of the epitaxial layer 32.

Figure 3J:
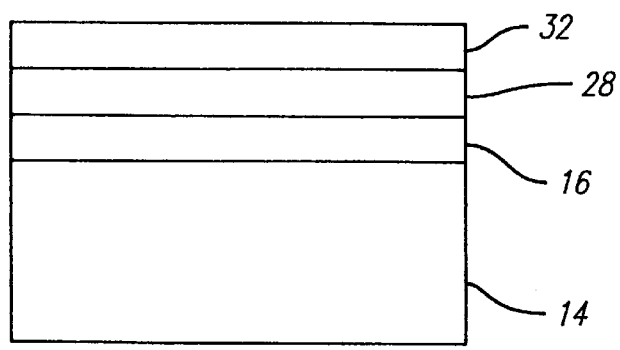
Figure 3K:
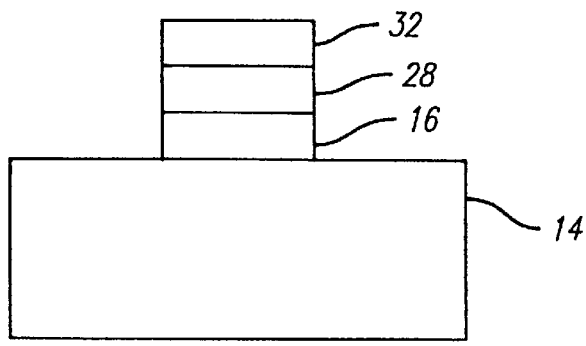

FIG. 3J shows exposing epitaxial layer 32 by removing third wafer 30. FIG. 3K shows etching epitaxial layer 32, epitaxial layer 28, and epitaxial layer 16. The etching is done to provide device isolation between individual APDs.

Figure 3L:
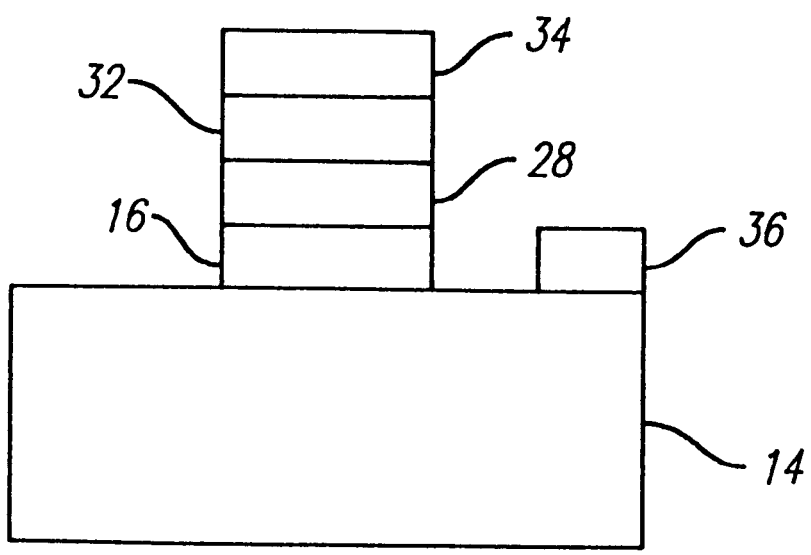

FIG. 3L shows adding contact 34 to epitaxial layer 32 and contact 36 to wafer 14. Contact 34 and contact 36 can be the same material, or different materials. Contact 34 is typically a gold/zinc blend, and contact 36 is typically gold. Additional materials, such as dielectric materials, can be added to provide further device isolation.

Fabrication and Testing Results

Avalanche photodetectors were constructed by two different methods, one using a single fusion step and another using two separate fusion steps. In the single fusion method, a molecular beam epitaxy (MBE) grown $In_{0.53}Ga_{0.47}As$/InP wafer (crystal orientation (100)) was fused to an epitaxial silicon layer grown on a silicon substrate (crystal orientation (100)) with a shallow p-type ion implant at its surface. The epitaxial $In_{0.53}Ga_{0.47}As$ layers consisted of a 0.2 $\mu$m thick p+ layer and a 2.0 $\mu$m thick intrinsic layer. After the fusion step the InP substrate was removed.

In the two step fusion method, first a 1.0 $\mu$m thick metal-organic chemical vapor deposition (MOCVD) grown intrinsic $In_{0.53}Ga_{0.47}As$ layer on an InP substrate (crystal orientation (100)) was fused to an intrinsic epitaxial Si layer grown on an n+ substrate (crystal orientation (100)) with a shallow p-type ion implant at its surface. After the first fusion step, the InP substrate was selectively removed leaving only the InGaAs epitaxial layer. A second 0.2 $\mu$m MOCVD grown p+ doped $In_{0.53}Ga_{0.47}As$ layer on an InP substrate was then fused to the first InGaAs layer and the InP substrate subsequently removed. Fusion steps were done by placing the epitaxial layers in direct contact under pressure at temperatures of 650° C. for 20 minutes in an $H_2$ atmosphere. TEM scans of the fused junction between InGaAs and Si show covalent bonding between the materials. Also visible are edge dislocations that remain at the interface and do not thread up into the epitaxial layers. The two fusion step process was used to avoid diffusion of p-type dopants from the p+ InGaAs layer into the intrinsic InGaAs layer during MOCVD growth. Some dopant diffusion is unavoidable when the intrinsic layer is grown directly over the p+ layer.

The epitaxial layers of the finished device for both the single and two fusion step processes are as follows, starting from the topmost layer. First, a 0.2 $\mu$m thick $In_{0.53}Ga_{0.47}As$ p+ layer with a doping level of $2 \times 10^{19}$ $cm^{-3}$ is used for ohmic metal contact. The second region is a 1.0 $\mu$m or 2.0 $\mu$m thick intrinsic $In_{0.53}Ga_{0.47}As$ layer unintentionally doped n-type used for photon absorption. This layer was fused to a Si surface implanted with a shallow 10 keV, $1.3 \times 10^{12}$ $cm^{-2}$ dose of boron atoms (p-type). Below this implant was a 2.5 $\mu$m intrinsic epitaxial Si layer, unintentionally doped n-type with a doping level of approximately $5 \times 10^{14}$ $cm^{-3}$. This layer serves as the multiplication region for the detector and was grown on an n+ substrate with a doping level of $1\times10^{18}$ cm$^{-3}$. The implantation dose in the Si was calculated to ensure that the electric field in the intrinsic Si region is higher than that in the intrinsic InGaAs region when the device is biased at operating voltages. For significant avalanche gain in the multiplication region, electric fields of 240 kV/cm to 300 kV/cm will be present, while the field in the InGaAs will remain below 100 kV/cm. Fields of this strength in the InGaAs layer allow for electron velocities of over $7\times10^6$ cm/sec through the region but inhibit avalanche multiplication.

After the fusion and InP substrate removal steps, further fabrication steps proceeded as follows. First the epitaxial InGaAs and Si layers were etched through leaving only circular mesas of variable diameter to provide device isolation. A reactive ion etcher (RIE) using a mixture of methane-hydrogen-argon gas was used for etching InGaAs and an RIE using $Cl_2$ was used for etching Si. A top metal layer of AuZn/Ni served as an etch mask for the devices as well as a top p-type contact. Dielectric layers and n-type metal contacts were also added to allow for probing.

Results

Amplification region: Silicon, unintentionally doped to $5\times10^{14}$ cm$^{-3}$ Absorption region: indium gallium arsenide, $In_{0.53}Ga_{0.47}As$ Fusion conditions: 650° C., 20 minutes Illumination: 1.3 and 1.55 $\mu$m wavelength lasers, backlighting the detector through the silicon wafer. The expected response of the detector is only between 1.0 and 1.65 $\mu$m.

Upon illumination with 1.3 and 1.55 $\mu$m lasers, dark current versus reverse bias and photocurrent versus reverse bias curves exhibited expected characteristics. Measurements indicated a large initial increase in the photocurrent and dark current for a small increase in the reverse bias, then a relatively flat region where the InGaAs absorption layer and p-type ion implant in the Si are being depleted and the gain is approximately one. There is then a visible kink in the response curve with the onset of avalanche gain. Gains of over 25 were measured for incident light levels of around 20 $\mu$W and gains of over 130 were measured for light levels of around 2 $\mu$W.

When the illumination wavelength was changed to 920 nanometers, no photocurrent multiplication was observed. Since silicon is not transparent at this wavelength, the light was absorbed in the silicon layer. Hole diffusion to the junction between silicon and InGaAs prevented any photocurrent multiplication.

Frequency response measurements were also made on the detectors using an HP 8703a Lightwave Component Analyzer. For a 23 $\mu$m diameter device illuminated with a 1.3 $\mu$m laser, at a gain of 10, a 3-dB bandwidth of 820 MHz was measured. At a gain of 135, a 3-dB bandwidth of 600 MHz was measured yielding a gain-bandwidth product of 81 GHz. This measured gain-bandwidth product is near the highest gain-bandwidth products reported for InGaAs/InP avalanche photodetectors.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A photodetector comprising:

a first semiconductor layer including an absorption region, said absorption region being configured to receive optical signals and generate electrical signals in response thereto, said first semiconductor layer having a first lattice constant; and second semiconductor layer having a second lattice constant different than said first lattice constant and including a multiplication region, said first semiconductor layer contacting said second semiconductor layer, said multiplication region being configured to amplify said electrical signals generated by said absorption region, said first and second semiconductor layers further being configured so that a potential can be applied across said first and second semiconductor layers, said potential creating an electric field in said first and second semiconductor layers, said electric field having a magnitude greater in said multiplication region than in said absorption region, wherein said absorption region comprises a material selected from the group of:

InAs, InSb, InP, $In_xGa_{1-x}As$, $InAs_yP_{1-y}$, $InP_yAs_{1-y}$, $In_xGa_{1-x}N$, $In_xGa_{1-x}As_ySb_{1-y}$, $In_xGa_{1-x}As_yP_{1-y}$, $In_xGa_yAl_{1-x-y}As$, $Pb_xSn_{1-x}Te$, AlSb, AlAs, $Al_xGa_{1-x}N$, ZnSe, ZnTe, BN, Ge, GaP, GaAs, GaSb, $Ga_xAl_{1-x}As$, $GaAs_yP_{1-y}$, $Ga_xIn_{1-x}P$, $Ga_xIn_{1-x}Sb$, $Hg_xCd_{1-x}Te$, wherein x and y are numbers satisfying:

$0 \leq x \leq 1$; and $0 \leq y \leq 1$.

2. A photodetector in accordance with claim 1, wherein said electric field has an average magnitude greater in said multiplication region than in said absorption region.

3. A photodetector in accordance with claim 1, wherein said electric field has a magnitude within a range of 240 kV/cm to 300 kV/cm in said multiplication region and has a magnitude less than 100 kV/cm in said absorption region.

4. A photodetector in accordance with claim 1, wherein said electric field has an average magnitude within a range of 240 kV/cm to 300 kV/cm in said multiplication region and has an average magnitude less than 100 kV/cm in said absorption region.

5. A photodetector in accordance with claim 1, wherein said optical signals have a wavelength within a range of 1.0 $\mu$m and 1.65 $\mu$m.

6. A photodetector comprising:

a first semiconductor layer including an absorption region, said absorption region being configured to receive optical signals and generate electrical signals in response thereto, said first semiconductor layer having a first lattice constant; and second semiconductor layer having a second lattice constant different than said first lattice constant and including a multiplication region, said first semiconductor layer contacting said second semiconductor layer, said multiplication region being configured to amplify said electrical signals generated by said absorption region, said first and second semiconductor layers further being configured so that a potential can be applied across said first and second semiconductor layers, said potential creating an electric field in said first and second semiconductor layers, said electric field having a magnitude greater in said multiplication region than in said absorption region, wherein said multiplication region comprises a group IV element.

7. A photodetector in accordance with claim 6, wherein said group IV element is silicon.

8. A photodetector in accordance with claim 6, wherein said electric field has a magnitude within a range of 240 kV/cm to 300 kV/cm in said multiplication region and has a magnitude less than 100 kV/cm in said absorption region.

9. A photodetector in accordance with claim 6, wherein said electric field has an average magnitude within a range of 240 kV/cm to 300 kV/cm in said multiplication region and has an average magnitude less than 100 kV/cm in said absorption region.

10. A photodetector in accordance with claim 6, wherein said optical signals have a wavelength within a range of 1.0 $\mu$m and 1.65 $\mu$m.

11. A photodetector, comprising:
   a first semiconductor layer including an absorption region, said first semiconductor layer having a first lattice constant; and
   a second semiconductor layer having a second lattice constant different than said first lattice constant and including a multiplication region, said first semiconductor layer contacting said second semiconductor layer, said absorption region being configured to receive optical signals propagating through said second semiconductor layer and generate electrical signals in response thereto, said multiplication region being configured to amplify said electrical signals generated by said absorption region, wherein said absorption region comprises a material selected from the group of:
   InAs, InSb, InP, $In_xGa_{1-x}As$, $InAs_yP_{1-y}$, $InP_yAs_{1-y}$, $In_xGa_{1-x}N$, $In_xGa_{1-x}As_ySb_{1-y}$, $In_xGa_{1-y}As_yP_{1-y}$, $In_xGa_yAl_{1-x-y}As$, $Pb_xSn_{1-x}Te$, AlSb, AlAs, $Al_xGa_{1-x}N$, ZnSe, ZnTe, BN, Ge, GaP, GaAs, GaSb, $Ga_xAl_{1-x}As$, $GaAs_yP_{1-y}$, $Ga_xIn_{1-x}P$, $Ga_xIn_{1-x}Sb$, $Hg_xCd_{1-x}Te$,
   wherein x and y are numbers satisfying:
   $0 \leq x \leq 1$; and $0 \leq y \leq 1$.

12. A photodetector in accordance with claim 11, wherein said optical signals have a wavelength within a range of 1.0 $\mu$m to 1.65 $\mu$m.

13. A photodetector, comprising:
   a first semiconductor layer including an absorption region, said first semiconductor layer having a first lattice constant; and
   a second semiconductor layer having a second lattice constant different than said first lattice constant and including a multiplication region, said first semiconductor layer contacting said second semiconductor layer, said absorption region being configured to receive optical signals propagating through said second semiconductor layer and generate electrical signals in response thereto, said multiplication region being configured to amplify said electrical signals generated by said absorption region, wherein said multiplication region comprises a group IV element.

14. A photodetector in accordance with claim 13, wherein said group IV element is silicon.

15. A photodetector in accordance with claim 13, wherein said optical signals have a wavelength within a range of 1.0 $\mu$m to 1.65 $\mu$m.

16. A photodetector, comprising:
   a first semiconductor layer including an absorption region, said first semiconductor layer having a first lattice constant; and
   a second semiconductor layer having a second lattice constant different than said first lattice constant and including a multiplication region, said first semiconductor layer contacting said second semiconductor layer, said absorption region being configured to receive optical signals propagating through said second semiconductor layer and generate electrical signals in response thereto, said multiplication region being configured to amplify said electrical signals generated by said absorption region, said photodetector having a gain in excess of 10, wherein said absorption region comprises a material selected from the group of:
   InAs, InSb, InP, $In_xGa_{1-x}As$, $InAs_yP_{1-y}$, $InP_yAs_{1-y}$, $In_xGa_{1-x}N$, $In_xGa_{1-x}As_ySb_{1-y}$, $In_xGa_{1-x}As_yP_{1-y}$, $In_xGa_yAl_{1-x-y}As$, $Pb_xSn_{1-x}Te$, AlSb, AlAs, $Al_xGa_{1-x}N$, ZnSe, ZnTe, BN, Ge, GaP, GaAs, GaSb, $Ga_xAl_{1-x}As$, $GaAs_yP_{1-y}$, $Ga_xIn_{1-x}P$, $Ga_xIn_{1-x}Sb$, $Hg_xCd_{1-x}Te$,
   wherein x and y are numbers satisfying:
   $0 \leq x \leq 1$; $0 \leq y \leq 1$.

17. A photodetector in accordance with claim 16, wherein said optical signals have a wavelength within a range of 1.0 $\mu$m and 1.65 $\mu$m.

18. A photodetector in accordance with claim 16, wherein said gain is at least equal to 40.

19. A photodetector, comprising:
   a first semiconductor layer including an absorption region, said first semiconductor layer having a first lattice constant; and
   a second semiconductor layer having a second lattice constant different than said first lattice constant and including a multiplication region, said first semiconductor layer contacting said second semiconductor layer, said absorption region being configured to receive optical signals propagating through said second semiconductor layer and generate electrical signals in response thereto, said multiplication region being configured to amplify said electrical signals generated by said absorption region, said photodetector having a gain in excess of 10, wherein said multiplication region comprises a group IV element.

20. A photodetector in accordance with claim 19, wherein said absorption region comprises indium gallium arsenide.

21. A photodetector in accordance with claim 19, wherein said group IV element is silicon.

22. A photodetector in accordance with claim 19, wherein said optical signals have a wavelength within a range of 1.0 $\mu$m to 1.65 $\mu$m.

23. A photodetector in accordance with claim 19, wherein said gain is at least equal to 40.

24. A photodetector, comprising:
   a substrate;
   a first semiconductor layer comprising silicon provided on said substrate;
   a second semiconductor layer comprising indium gallium arsenide provided on said first semiconductor layer;
   a third semiconductor layer comprising a group III–V semiconductor provided on said second semiconductor layer;
   a first electrical contact layer coupled to said substrate; and
   a second electrical contact layer coupled to said third semiconductor layer, wherein said second semiconductor layer comprises an absorption region configured to receive optical signals and generate electrical signals in response thereto, and said first semiconductor layer comprises a multiplication region configured to amplify said electrical signals.

25. A photodetector in accordance with claim 24, wherein said third semiconductor layer has a first conductivity type and said substrate has a second conductivity type.

26. A photodetector in accordance with claim 24, wherein said group III–V semiconductor is indium gallium arsenide.

27. A photodetector in accordance with claim 24, wherein said multiplication region is configured to receive said optical signals via said substrate and said first semiconductor layer.

28. A photodetector in accordance with claim 24, wherein said optical signals have a wavelength within a range of 1.0 μm and 1.65 μm.

29. A photodetector in accordance with claim 24, wherein a potential is applied across said first and second electrical contact layers, said potential creating an electric field in said first and second semiconductor layers, said electric field having a magnitude greater in said multiplication region than in said absorption region.

30. A photodetector in accordance with claim 24, wherein said photodetector has a gain greater than 10.

31. A photodetector in acordance with claim 30, wherein said gain is at least equal to 40.

* * * * *